United States Patent
Jafarian-Tehrani et al.

(10) Patent No.: US 6,919,689 B2
(45) Date of Patent: Jul. 19, 2005

(54) METHOD FOR TOOLMATCHING AND TROUBLESHOOTING A PLASMA PROCESSING SYSTEM

(75) Inventors: Seyed Jafar Jafarian-Tehrani, Fremont, CA (US); Armen Avoyan, Glendale, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 10/721,439

(22) Filed: Nov. 24, 2003

(65) Prior Publication Data

US 2004/0104734 A1 Jun. 3, 2004

Related U.S. Application Data

(63) Continuation-in-part of application No. 10/341,913, filed on Jan. 13, 2003, now Pat. No. 6,873,114.
(60) Provisional application No. 60/414,108, filed on Sep. 26, 2002.

(51) Int. Cl.$^7$ .......................... H01J 7/24; G01R 31/08; C23C 14/00
(52) U.S. Cl. ...................... 315/111.71; 315/111.21; 324/519; 118/50.1
(58) Field of Search ................... 315/111.21, 111.31, 315/111.71, 111.41; 118/723 R, 50, 50.1; 324/519, 464, 459, 693; H01J 7/24; G01R 31/08; C23C 14/00

(56) References Cited

U.S. PATENT DOCUMENTS 5,565,737 A  10/1996 Keane ............... 315/111.21
5,939,886 A   8/1999 Turner et al. ............ 324/464
6,265,831 B1 * 7/2001 Howald et al. ......... 315/111.21
6,326,794 B1 * 12/2001 Lundquist et al. .......... 324/678
6,498,502 B2 * 12/2002 Edwards et al. ........... 324/750
2001/0025691 A1 * 10/2001 Kanno et al. ............... 156/345
2002/0088776 A1 * 7/2002 Nakano et al. ......... 219/121.43
2002/0157608 A1 * 10/2002 Nakano et al. ..... 118/723 MW
2003/0038114 A1 * 2/2003 Howald ....................... 216/67
2003/0178140 A1   9/2003 Hanazaki et al. ...... 156/345.28
2004/0135590 A1   7/2004 Quon ......................... 324/713

OTHER PUBLICATIONS

SmartPIM with ImPrint—A Better, Faster Way to Fault Detection and Classification (FDC), 2001 Scientific Systems, 4 pages.

* cited by examiner

Primary Examiner—Trinh Vo Dinh
(74) Attorney, Agent, or Firm—Thelen, Reid, Priest, LLP; Thierry K. Lo

(57) ABSTRACT

A plasma processing system having a grounded chamber and an RF power feed connected to a bottom electrode is tested. A first capacitance between the bottom electrode and the grounded chamber is measured at atmosphere. Consumable hardware parts are installed in the chamber. A second capacitance between the bottom electrode and the grounded chamber is measured at vacuum with the grounded chamber including all of the installed consumable hardware parts. The first capacitance measurement and the second capacitance measurement are respectively compared with a first reference value and a second reference value to identify and determine any defects in the plasma processing system. The first and second reference value respectively are representative of the capacitance of a defect-free chamber at atmosphere and the capacitance of a defect-free chamber including all of the installed consumable hardware parts at vacuum.

21 Claims, 4 Drawing Sheets

METHOD FOR TOOLMATCHING AND TROUBLESHOOTING A PLASMA PROCESSING SYSTEM

STATEMENT OF RELATED APPLICATION

The present application is a continuation-in-part of U.S. patent application Ser. No. 10/341,913, filed Jan. 13, 2003, now U.S. Pat. No. 6,873,114 in the name of inventors Armen Avoyan and Seyed Jafar Jafarian-Tehrani, entitled "Method for toolmatching and troubleshooting a plasma processing system", commonly assigned herewith. U.S. patent application Ser. No. 10/341,913, filed Jan. 13, 2003, claims the benefit of U.S. Provisional Patent Application Ser. No. 60/414,108, filed Sep. 26, 2002, in the name of inventors Armen Avoyan and Seyed Jafar Jafarian-Tehrani, commonly assigned herewith.

FIELD OF THE INVENTION

The present invention relates to the fabrication of materials such as electronic devices in plasma processing system. More particularly, the present invention relates to a method and system for verifying the operation of a plasma processing system.

BACKGROUND OF THE INVENTION

Material processing with ionized gases, such as plasma etching and reactive ion etching, are increasing in importance, particularly in the area of semiconductor device manufacturing. Capacitively and inductively coupled plasma etching systems may be used in the fabrication of semiconductor devices. FIG. 1 illustrates a conventional plasma processing system 100 including a plasma reactor 102 having a plasma chamber 104 therein. An RF power supply 106 supplies RF power via a local matching network 108 to an electrode 110 in the plasma chamber 104.

Chamber wear and polymer deposits cause the plasma processing chamber to produce inconsistent results over a period of time. Plasma processing chamber wear occurs when hardware parts in the plasma chamber are used and eventually need to be replaced. These consumable hardware parts have a limited lifetime usage. For example, an electrostatic chuck (ESC) supporting a wafer in the plasma chamber has a typical lifetime of about 3000–5000 RF hours. Other problems such as improper hardware assembly may also cause the plasma processing chamber to yield inconsistent results.

Several methods have been developed to obtain better consistent results with plasma processing chambers. For example, the torque applied to coupling means, such as nuts and bolts, coupling hardware parts together may be measured and compared with a reference value provided by the manufacturer of the plasma chamber. Other methods include "eye balling" the electrode centering for proper hardware installation.

A need therefore exists for a simple, fast, and accurate method to verify the correct assembly of chamber hardware parts and to troubleshoot chamber plasma processing systems.

BRIEF DESCRIPTION OF THE INVENTION

A plasma processing system having a grounded chamber and an RF power feed connected to a bottom electrode is tested. A first capacitance between the bottom electrode and the grounded chamber is measured at atmosphere. Consumable hardware parts are installed in the chamber. A second capacitance between the bottom electrode and the grounded chamber is measured at vacuum with the grounded chamber including all of the installed consumable hardware parts. The first capacitance measurement and the second capacitance measurement are respectively compared with a first reference value and a second reference value to identify and determine any defects in the plasma processing system. The first and second reference value respectively are representative of the capacitance of a defect-free chamber at atmosphere and the capacitance of a defect-free chamber including all of the installed consumable hardware parts at vacuum.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
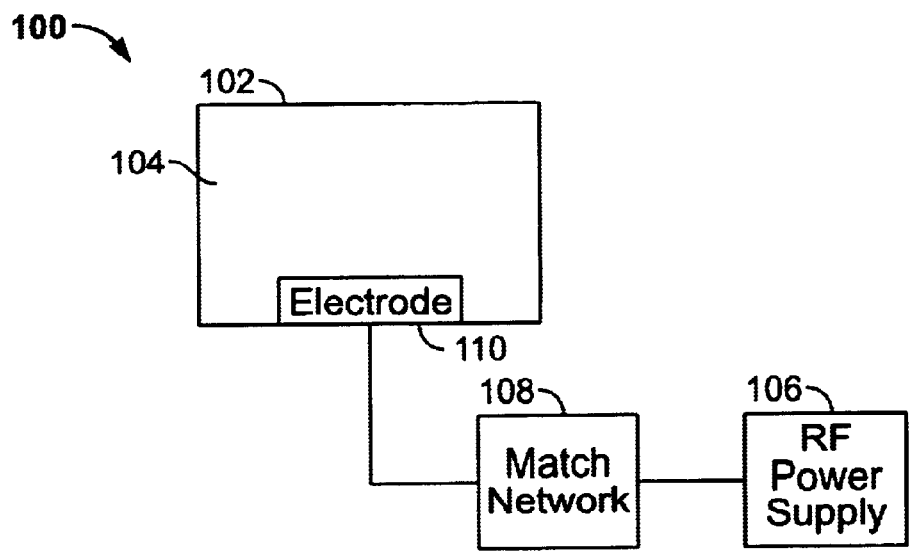
FIG. 1 is a diagram schematically illustrating a conventional plasma processing system in accordance with a prior art.

Embodiments of the present invention are described herein in the context of a plasma processing system. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

A plasma processing system typically consists of an assembly of consumable hardware parts with a plasma chamber. These consumable hardware parts are used during the plasma process and include, among others, all removable hardware parts such as the Quartz confinement rings, electrostatic chuck (ESC), silicon electrode, etc . . . The hardware parts also include, among others, power supply connections, circuit boards, the chamber lid. These consumable hardware parts have a limited lifetime usage and are eventually replaced. For example, Quartz confinement rings have a typical lifetime of about 100–200 RF hours. An electrostastic chucks (ESC) has a typical lifetime of about 3000–5000 RF hours. Quartz hardware exposed to plasma has a typical lifetime of about 150–300 RF hours. A silicon electrode has a typical lifetime of about 1000 RF hours. A Silicon Carbide (SiC) baffle has a typical lifetime of about 3000 RF hours. Those of ordinary skill in the art will appreciate that the above described hardware parts are not intended to be limiting and that other hardware parts can be used without departing from the inventive concepts herein disclosed.

Figure 2:
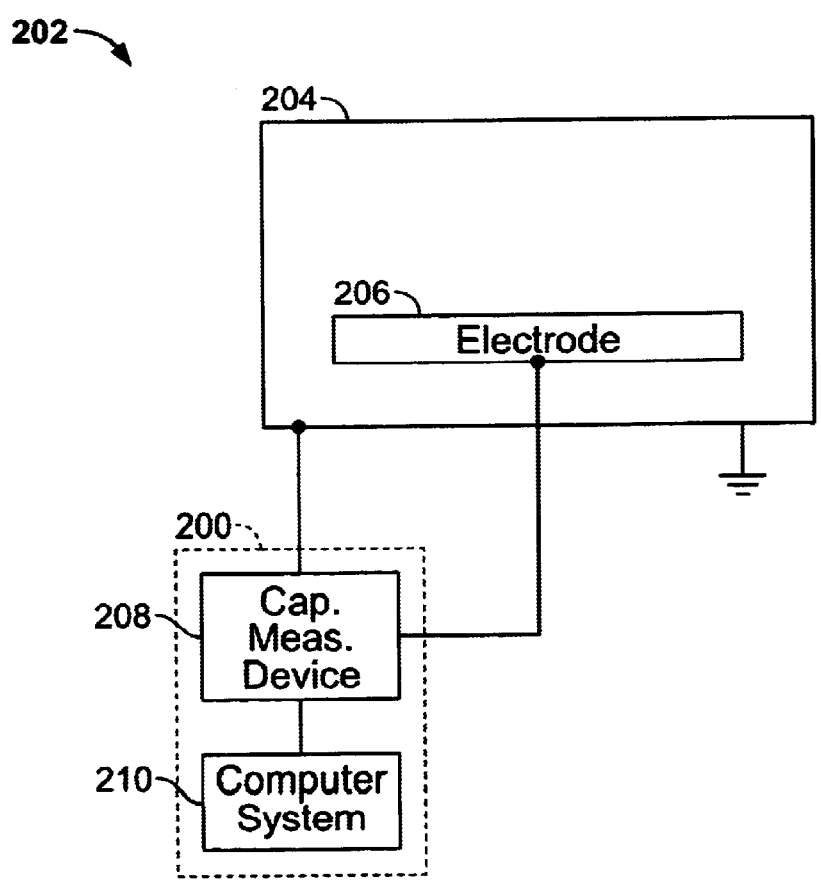
FIG. 2 is a diagram schematically illustrating an apparatus for troubleshooting a plasma processing system in accordance with one embodiment of the present invention.

FIG. 2 is a diagram schematically illustrating an apparatus 200 for troubleshooting a plasma etching system 202 in accordance with one embodiment of the present invention. The plasma etching system 202 includes a grounded chamber 204 having a bottom electrode 206. The plasma chamber 204 is stripped of all consumable hardware parts and assemblies as described above.

The apparatus 200 includes a capacitance measuring device 208 and a computer system 210. The capacitance measuring device 208 is coupled to the grounded chamber 204 and the bottom electrode 206. The capacitance measuring device 208 measures the capacitance between the grounded chamber 204 and the bottom electrode 206. In accordance with one embodiment of the present invention, the capacitance measuring device 208 may be, for example, an RLC sensor. Those of ordinary skills in the art will recognize that many varieties of capacitance sensors may be applied to the present invention.

The computer system 210 is coupled to the capacitance measuring device 208. The computer system 210 receives the measured data (the capacitance) from the capacitance measuring device 208. The computer system 210 allows a user to verify whether the plasma etching system 202 is free of any defects and whether the chamber hardware parts are assembled correctly by analyzing the measured data. The algorithm within the computer system 210 is further discussed in more detail below with respect to FIGS. 4 and 5.

Capacitance measurements at some fixed frequency, for example, low frequency, may be used to troubleshoot, toolmatch, and partition chamber faults for plasma processing systems. In a capacitively coupled RF plasma etching system, the chamber hardware parts that constitute RF path are seen (by the power feed) as capacitors for which an equivalent circuit can be drawn. Therefore, by measuring capacitance of each and every component on the RF path, the overall capacitance of a plasma etching system can be established and baselined for manufacturing specification. A specification of a fully assembled chamber, as well as individual parts, components, and hardware assemblies can be established. For example, the capacitance measurement procedure may be carried out after a wet clean, with brand new parts. The following table illustrates an example of the capacitance measurement at different stages:

| | |
|---|---|
| Chamber at Atmosphere, all parts removed, ESC PCB disconnected: | 237.0 ± 3.0 pF |
| Chamber at Atmosphere, all parts removed, ESC PCB connected: | 228.0 ± 3.0 pF |
| Chamber at Vacuum, all parts installed with ESC PCB connected: | 309.0 ± 5.0 pF |
| Chamber at Vacuum, all parts installed with ESC PCB disconnected: | 319.0 ± 5.0 pF |

Figure 3:
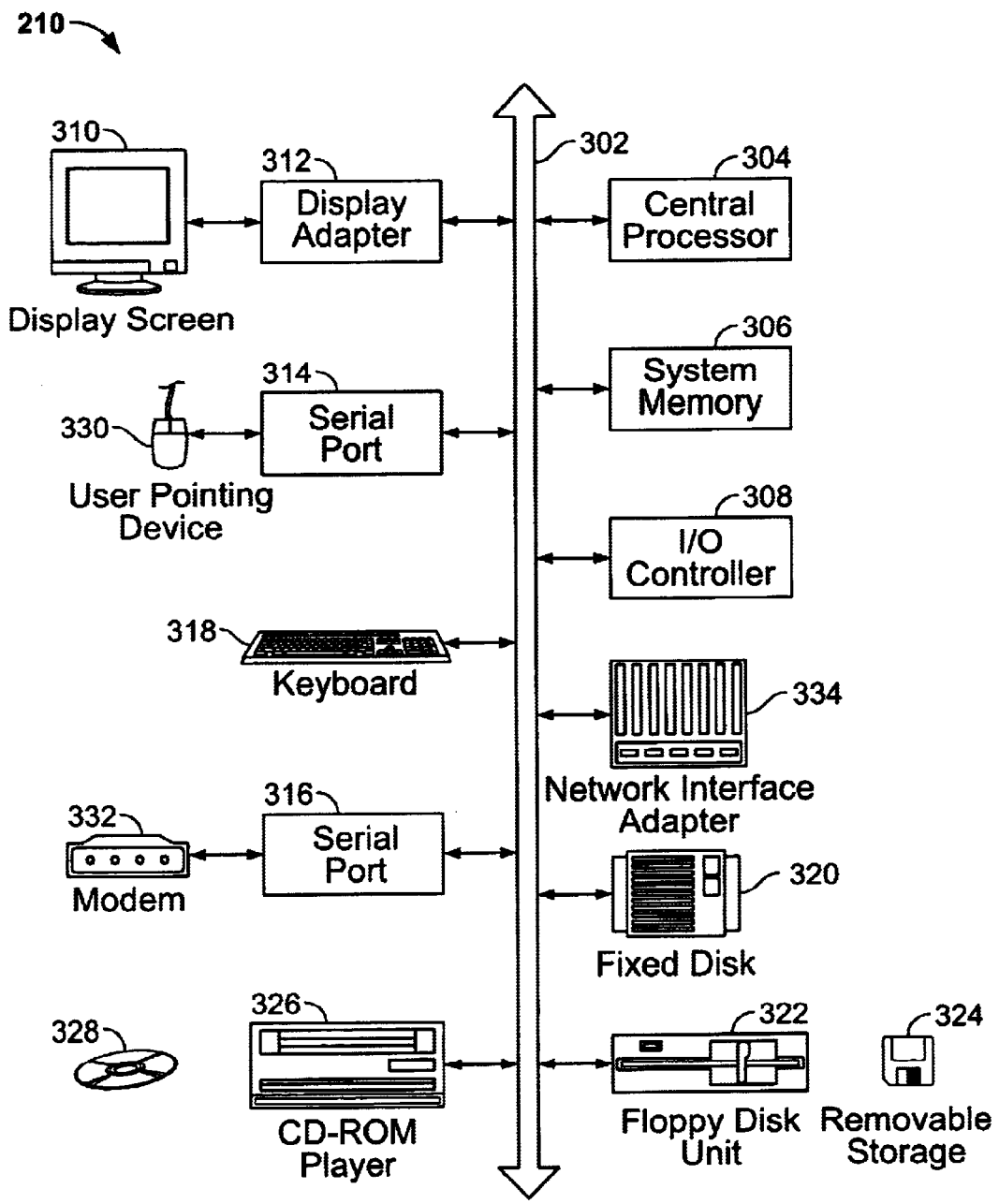
FIG. 3 is a block diagram of a computer system suitable for implementing aspects of the present invention.

FIG. 3 depicts a block diagram of the computer system 210 suitable for implementing aspects of the present invention. As shown in FIG. 3, computer system 210 includes a bus 302 which interconnects major subsystems such as a central processor 304, a system memory 306 (typically RAM), an input/output (I/O) controller 308, an external device such as a display screen 310 via display adapter 312, serial ports 314 and 316, a keyboard 318, a fixed disk drive 320, a floppy disk drive 322 operative to receive a floppy disk 324, and a CD-ROM player 326 operative to receive a CD-ROM 328. The system memory 306 may contain the algorithms described in FIGS. 4 and 5. Many other devices can be connected, such as a pointing device 330 (e.g., a mouse) connected via serial port 314 and a modem 332 connected via serial port 316. Modem 332 may provide a direct connection to a remote server via a telephone link or to the Internet via a POP (point of presence). Alternatively, a network interface adapter 334 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 3 to be present to practice the present invention, as discussed below. Furthermore, the devices and subsystems may be interconnected in different ways from that shown in FIG. 3. The operation of a computer system such as that shown in FIG. 3 is readily known in the art and is not discussed in detail in this application, so as not to overcomplicate the present discussion. Code to implement the present invention may be operably disposed in system memory 306 or stored on storage media such as fixed disk 320, floppy disk 324 or CD-ROM 328.

Figure 4:
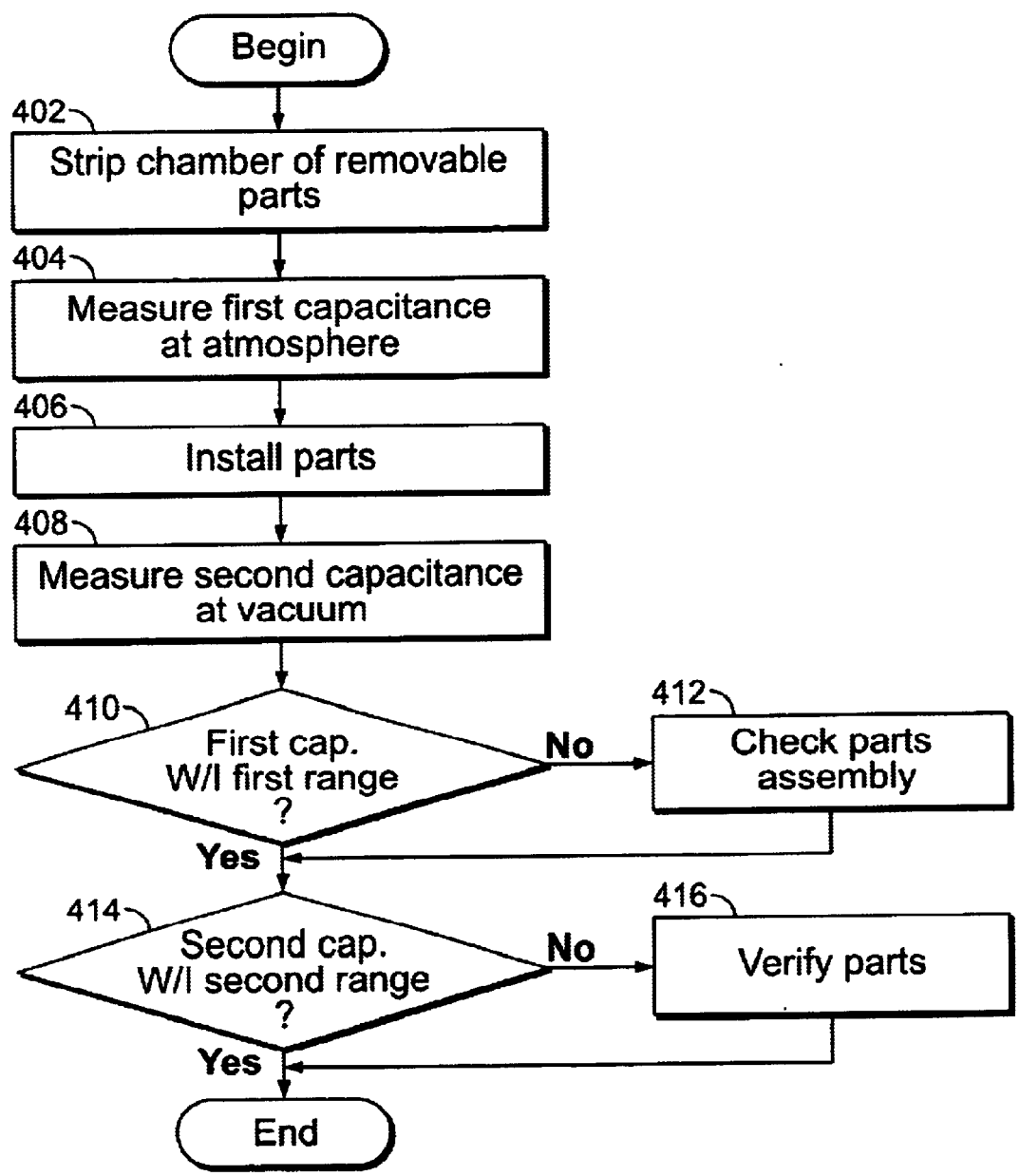
FIG. 4 is a flow diagram schematically illustrating a method for troubleshooting a plasma processing system in accordance with one embodiment of the present invention.

FIG. 4 is a flow diagram schematically illustrating a method for troubleshooting a plasma etching system in accordance with one embodiment of the present invention. Beginning at 402, the grounded chamber 204, at atmospheric pressure, is striped of all consumable hardware parts and assemblies. The power supplies, printed circuit boards, and other electrical components that influence the measured capacitance are disconnected from the grounded chamber 204. Using a connector, for example a clip, the capacitance measuring device 208 is electrically coupled to the bottom electrode 206 through an RF power feed rod (not shown) and to the grounded chamber 204.

At 404, the capacitance measuring device 208 measures the capacitance between the bottom electrode 206 and the grounded chamber 204 of the stripped chamber 204 at atmospheric pressure. This first capacitance measurement is recorded in the computer system 210. At 406, all chamber hardware parts are installed in the chamber 204 and the chamber 204 is pumped down to a vacuum. The capacitance measuring device 208 measures the capacitance of the fully assembled chamber at vacuum at 408. This second capacitance measurement is recorded in the computer system 210.

At 410, the computer system 210 compares the first capacitance measurement with a first reference value stored in the database of computer system 210. The first reference value represents the capacitance of a stripped chamber without defects at atmospheric pressure. The first reference value may be obtained by performing statistical analysis of chamber capacitance values obtained on a number of similar chambers that passed through manufacturing and establishes a specification.

At 412, if the first capacitance measurement deviates from a specified range of the first reference value, for example, a range of 10%, the computer system 210 alerts or notifies that the plasma etching system 202 does not conform to manufacturing specification at atmospheric pressure. Therefore, the plasma etching system 202 needs to be checked for possible improper chamber assembly, inadequate torque requirements, and/or substandard parts among others. Improper chamber assembly may include, among other things, an electrode not fully centered, upside down baffles installed, etc . . . Inadequate torque requirements may happen when an assembly is coupled too tightly or too loose. Substandard parts may include parts that do not satisfy the original manufacturer specifications. The above examples are not meant to be limiting in any way and other possible problems may exist if the first capacitance measurement does not fall within the specified range.

At 414, the computer system 210 compares the second capacitance measurement with a second reference value stored in the database of computer system 210. The second reference value represents the capacitance of a fully assembled chamber without defects at vacuum. The second reference value may be obtained by performing statistical analysis of chamber capacitance values obtained on a number of similar chambers that passed through manufacturing and establishes the specification. This specification may used for quality control purposes and may be an integral part of a field startup procedure for chamber hardware verification purposes.

At 416, if the second capacitance measurement deviates from a specified range of the second reference value, for example, a range of 10%, the computer system 210 alerts or notifies that the plasma etching system 202 does not conform to manufacturing specification at vacuum. Therefore, the plasma etching system 202 needs to be checked for possible improper chamber assembly, inadequate torque requirements, substandard parts, missing hardware parts, chamber wear and/or arcing. As illustrated above, improper chamber assembly may include among other things, an electrode not fully centered, upside down baffles installed, etc. Inadequate torque requirements may happen when an assembly is coupled too tightly or too loose. Substandard parts may include parts that do not satisfy the original manufacturer specifications. The above examples are not meant to be limiting in any way and other possible problems may exist if the second capacitance measurement does not fall within the specified range.

Figure 5:
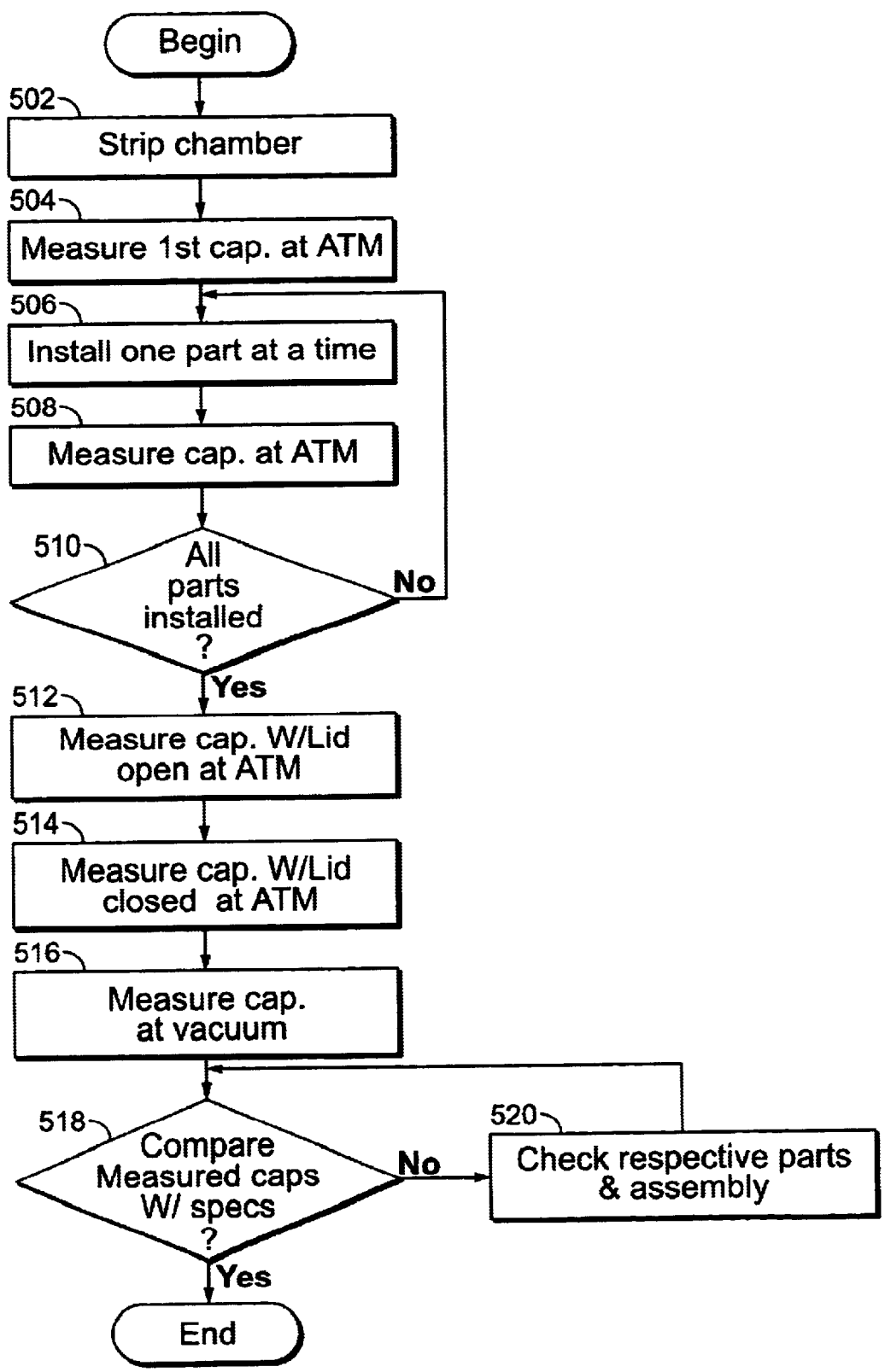
FIG. 5 is a flow diagram schematically illustrating a method for troubleshooting a plasma processing system in accordance with an alternative embodiment of the present invention.

FIG. 5 is a flow diagram schematically illustrating a method for troubleshooting a plasma etching system 202 in accordance with another embodiment of the present invention. Beginning at 502, the chamber 204, at atmospheric pressure, is striped of all consumable hardware parts and assemblies. As described above, the consumable hardware parts include among other things, power supplies, printed circuit boards, and other electrical components that influence the measured capacitance are disconnected from the chamber 202. Using a connector, for example a clip, the capacitance measuring device 208 is electrically coupled to the bottom electrode 206 through an RF power feed rod (not shown) and to the grounded chamber 204.

At 504, the capacitance measuring device 208 measures the capacitance between the bottom electrode 206 and the grounded chamber 204. This first capacitance measurement is recorded in the computer system 210. At 506, each consumable and/or removable chamber hardware part is installed one at a time. After each consumable and/or removable chamber hardware part is installed, the corresponding capacitance is measured while the chamber 204 is at atmospheric pressure at 508. The corresponding capacitance measurement is recorded in the computer system 210. At 510, the process reiterates back to 506 until all removable and/or consumable hardware parts have been installed.

The chamber 204 may also include a lid (not shown) that can be opened or closed. At 512, the capacitance measuring device 208 measures the capacitance of the chamber 204 at atmospheric pressure with the lid open. The corresponding measured data (the capacitance) is recorded in the computer system 210. At 514, the capacitance measuring device 208 measures the capacitance of the chamber 204 at atmospheric pressure with the lid closed. The corresponding measured data is also recorded in the computer system 210. At 516, the capacitance measuring device 208 measures the capacitance of the chamber 204 at vacuum with the lid closed. The corresponding measured data is also recorded in the computer system 210.

At 518, all the measured capacitance values recorded by the capacitance measuring device 208 and stored in the computer system 210 are compared with their corresponding reference values from the manufacturer specification of the chamber 204. The reference values represent the capacitance of a plasma etching system 202 without defects at each stage of installation. The reference capacitance values may be obtained by performing statistical analysis of chamber capacitance values obtained on a number of similar chambers that passed through manufacturing and establishes the specification. The reading from the measured capacitance values should be consistent with a specific tool set and hardware, and can be used as a benchmark for toolmatching purposes and troubleshooting.

At 520, if the measured capacitance values deviate from a specified range of their corresponding reference values, the computer system 210 alerts or notifies that the plasma etching system 202 does not conform to the manufacturer specification. Therefore, the plasma etching system 202 needs to be checked for possible improper chamber assembly, inadequate torque applied to coupling means, substandard parts, missing hardware parts, chamber wear and/or arcing. As illustrated above, improper chamber assembly may include among other things, an electrode not fully centered, upside down baffles installed, etc. Inadequate torque applied to coupling means may happen when the torque applied to the nuts and bolts coupling hardware parts together is inadequate (too tight or too loose). Substandard parts may include parts that do not satisfy the original manufacturer specifications. The above examples are not meant to be limiting in any way and other possible problems may exist if the capacitance measurements do not fall within the specified range of their corresponding reference values.

Furthermore, the method of FIG. 5 may be used to better diagnose the plasma etching system 202 by isolating the defect to the first removable and/or consumable hardware part installed that has a measured capacitance value that substantially deviates off its corresponding reference capacitance value.

The processes as described in FIGS. 4 and 5 may also be used for correlating with reference impedance values. Since capacitance is inversely related to impedance. The measured capacitance of the chamber 204 should correlate very well with measured impedance of the chamber 204. Thus respective trends and relative changes in magnitude of their values and correlation between the two can be established and used for troubleshooting plasma processing system faults. Therefore, the presently disclosed concept may be used in conjunction with chamber impedance measurements as previously disclosed.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for testing a plasma processing system having a grounded chamber and a bottom electrode, the method comprising:

measuring a first capacitance value between the bottom electrode and the grounded chamber at atmosphere;

installing consumable hardware parts to the chamber;

measuring a second capacitance value between the bottom electrode and the grounded chamber at vacuum, said grounded chamber including said consumable hardware parts; and comparing said first capacitance value with a first reference value, said second capacitance value with a second reference value, to identify and determine any defects in the plasma processing system, said first and second reference value respectively representative of the capacitance of a defect-free chamber at atmosphere and the capacitance of a defect-free chamber including said consumable hardware parts at vacuum.

2. The method of claim 1 wherein said consumable hardware parts further comprises individual parts, components, hardware assemblies, printed circuit boards, and power supplies.

3. The method of claim 1 further comprising:

measuring each change in capacitance between the bottom electrode and the grounded chamber at vacuum after each consumable hardware part is installed; and comparing each change in capacitance with a reference value representative of each change in capacitance of a defect-free chamber at vacuum.

4. The method of claim 1 further comprising:

measuring a third capacitance, at atmosphere, between the bottom electrode and the grounded chamber including said consumable hardware parts, wherein said consumable hardware parts further comprises a chamber lid in an open position.

5. The method of claim 4 further comprising:

measuring a fourth capacitance, at atmosphere, between the bottom electrode and the grounded chamber including said consumable hardware parts, wherein said consumable hardware parts further comprises a chamber lid in a closed position.

6. The method of claim 1 further comprising:

converting said second capacitance measurement to an impedance measurement; and comparing said impedance measurement with a reference impedance value, said reference impedance value representative of the impedance of a defect-free chamber including said consumable hardware parts at vacuum.

7. The method of claim 1 further comprising:

inspecting said consumable hardware parts when said second capacitance measurement is not within at least about 10% of said second reference value.

8. The method of claim 1 further comprising:

identifying the consumable hardware part causing a deviation of the capacitance measurement from a reference range.

9. An apparatus for testing a plasma etching system having a grounded chamber and a bottom electrode comprising:

a capacitance measurement device coupled to the grounded chamber and the bottom electrode; and a computer system coupled to said capacitance measurement device, wherein said computer system stores a first capacitance measurement value with the grounded chamber at atmosphere, stores a second capacitance measurement value with the grounded chamber including installed consumable hardware parts at vacuum, compares said first capacitance measurement value with a first reference value and said second capacitance measurement value with a second reference value, said first and second reference value respectively representative of the capacitance of a defect-free chamber at atmosphere and the capacitance of a defect-free chamber including said installed consumable hardware parts at vacuum, and identifies any defects in the plasma etching system.

10. The apparatus of claim 9 wherein said consumable hardware parts further comprises individual parts, components, hardware assemblies, printed circuit boards, and power supplies.

11. A program storage device readable by a machine, tangibly embodying a program of instructions executable by the machine to perform a method for testing a plasma processing system having a grounded chamber and a bottom electrode, the method comprising:

measuring a first capacitance value between the bottom electrode and the grounded chamber at atmosphere;

installing consumable hardware parts to the chamber;

measuring a second capacitance value between the bottom electrode and the grounded chamber at vacuum, said grounded chamber including said consumable hardware parts; and comparing said first capacitance value with a first reference value, said second capacitance value with a second reference value, to identify and determine any defects in the plasma processing system, said first and second reference value respectively representative of the capacitance of a defect-free chamber at atmosphere and the capacitance of a defect-free chamber including said consumable hardware parts at vacuum.

12. The method of claim 11 wherein said consumable hardware parts further comprises individual parts, components, hardware assemblies, printed circuit boards, and power supplies.

13. The method of claim 11 further comprising:

measuring each change in capacitance between the bottom electrode and the grounded chamber at vacuum after each consumable hardware part is installed; and comparing each change in capacitance with a reference value representative of each change in capacitance of a defect-free chamber at vacuum.

14. The method of claim 11 further comprising:

measuring a third capacitance, at atmosphere, between the bottom electrode and the grounded chamber including said consumable hardware parts, wherein said consumable hardware parts further comprises a chamber lid in an open position.

15. The method of claim 14 further comprising:

measuring a fourth capacitance, at atmosphere, between the bottom electrode and the grounded chamber including said consumable hardware parts, wherein said consumable hardware parts further comprises a chamber lid in a closed position.

16. The method of claim 11 further comprising:

converting said second capacitance measurement to an impedance measurement; and comparing said impedance measurement with a reference impedance value, said reference impedance value representative of the impedance of a defect-free chamber including said consumable hardware parts at vacuum.

17. The method of claim 11 further comprising:

inspecting said consumable hardware parts when said second capacitance measurement is not within at least about 10% of said second reference value.

18. The method of claim 11 further comprising:

identifying the consumable hardware part causing a deviation of the capacitance measurement from a reference range.

19. An apparatus for testing a plasma processing system having a grounded chamber and a bottom electrode, the apparatus comprising:

means for measuring a first capacitance value between the bottom electrode and the grounded chamber at atmosphere, and a second capacitance value between the bottom electrode and the grounded chamber at vacuum, said grounded chamber at vacuum including at least one installed consumable hardware part;

means for comparing said first capacitance value with a first reference value, said second capacitance value with a second reference value; and means for identifying and determining any defects in the plasma processing system, said first and second reference value respectively representative of the capacitance of a defect-free chamber at atmosphere and the capacitance of a defect-free chamber including at least one installed consumable hardware part at vacuum.

20. A plasma reactor comprising:

a grounded chamber;

a bottom electrode disposed in said grounded chamber;

a capacitance measurement device coupled to the grounded chamber and the bottom electrode; and a computer system coupled to said capacitance measurement device, wherein said computer system stores a first capacitance measurement value with the grounded chamber at atmosphere, stores a second capacitance measurement value with the grounded chamber including installed consumable hardware parts at vacuum, compares said first capacitance measurement value with a first reference value and said second capacitance measurement value with a second reference value, said first and second reference value respectively representative of the capacitance of a defect-free chamber at atmosphere and the capacitance of a defect-free chamber including said installed consumable hardware parts at vacuum, and identifies any defects in the plasma etching system.

21. The plasma reactor of claim 20 wherein said consumable hardware parts further comprises individual parts, components, hardware assemblies, printed circuit boards, and power supplies.

* * * * *